(12) United States Patent
Garcia et al.

(10) Patent No.: US 12,278,617 B2
(45) Date of Patent: *Apr. 15, 2025

(54) HIGH Q SOLIDLY-MOUNTED TRANSVERSELY-EXCITED FILM BULK ACOUSTIC RESONATORS

(71) Applicant: Murata Manufacturing Co., Ltd., Nagaokakyo (JP)

(72) Inventors: Bryant Garcia, Mississauga (CA); Greg Dyer, Santa Barbara, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 606 days.

This patent is subject to a terminal disclaimer.

(21) Appl. No.: 17/565,727

(22) Filed: Dec. 30, 2021

(65) Prior Publication Data

US 2022/0123726 A1 Apr. 21, 2022

Related U.S. Application Data

(63) Continuation-in-part of application No. 17/555,349, filed on Dec. 17, 2021, which is a
(Continued)

(51) Int. Cl.
*H03H 9/205* (2006.01)
*H03H 9/02* (2006.01)
*H03H 9/56* (2006.01)

(52) U.S. Cl.
CPC ........ *H03H 9/205* (2013.01); *H03H 9/02015* (2013.01); *H03H 9/02157* (2013.01); *H03H 9/02228* (2013.01); *H03H 9/568* (2013.01)

(58) Field of Classification Search
CPC .............. H03H 9/205; H03H 9/02015; H03H 9/02157; H03H 9/02228; H03H 9/568;
(Continued)

(56) References Cited

U.S. PATENT DOCUMENTS

| 5,204,575 A | 4/1993 | Kanda et al. |
| 5,274,345 A | 12/1993 | Gau |

(Continued)

FOREIGN PATENT DOCUMENTS

| CN | 106788318 A | 5/2017 |
| CN | 110417373 A | 11/2019 |

(Continued)

OTHER PUBLICATIONS

Gorisse et al., "Lateral Field Excitation of membrane-based Aluminum Nitride resonators," Joint Conference of the IEEE International Frequency Control and the European Frequency and Time Forum (FCS), May 2011, 5 pages.

(Continued)

*Primary Examiner* — Jorge L Salazar, Jr.
(74) *Attorney, Agent, or Firm* — ArentFox Schiff LLP

(57) ABSTRACT

Acoustic resonators and filters are disclosed. An acoustic resonator includes a substrate, a piezoelectric plate and an acoustic Bragg reflector between a surface of the substrate and a back surface of the piezoelectric plate. A conductor pattern on a front surface of the piezoelectric plate includes an interdigital transducer (IDT). The IDT includes a first busbar, a second busbar, and interleaved parallel fingers extending alternately from the first and second busbars. The fingers include a first finger and a last finger at opposing ends of the IDT. A first reflector element is proximate and parallel to the first finger and a second reflector element is proximate and parallel to the last finger. A distance pr between the first reflector element and the first finger and between the second reflector element and the last finger is greater than a pitch p of the IDT.

21 Claims, 9 Drawing Sheets

Related U.S. Application Data continuation-in-part of application No. 17/229,767, filed on Apr. 13, 2021, now Pat. No. 12,040,779.

(60) Provisional application No. 63/196,645, filed on Jun. 3, 2021, provisional application No. 63/074,991, filed on Sep. 4, 2020, provisional application No. 63/066,520, filed on Aug. 17, 2020, provisional application No. 63/012,849, filed on Apr. 20, 2020.

(58) Field of Classification Search
CPC .... H03H 2003/025; H03H 3/02; H03H 9/132; H03H 9/175
USPC .......................................... 333/133, 193–196
See application file for complete search history.

(56) References Cited

U.S. PATENT DOCUMENTS

| | | |
|---|---|---|
| 5,446,330 A | 8/1995 | Eda et al. |
| 5,552,655 A | 9/1996 | Stokes et al. |
| 5,631,515 A | 5/1997 | Mineyoshi et al. |
| 5,726,610 A | 3/1998 | Motorola |
| 5,729,186 A | 3/1998 | Seki et al. |
| 5,853,601 A | 12/1998 | Krishaswamy |
| 6,172,582 B1 | 1/2001 | Hickernell |
| 6,271,617 B1 | 8/2001 | Yoneda et al. |
| 6,377,140 B1 | 4/2002 | Ehara et al. |
| 6,516,503 B1 | 2/2003 | Ikada et al. |
| 6,540,827 B1 | 4/2003 | Levy et al. |
| 6,570,470 B2 | 5/2003 | Maehara et al. |
| 6,670,866 B2 | 12/2003 | Ella et al. |
| 6,707,229 B1 | 3/2004 | Martin |
| 6,710,514 B2 | 3/2004 | Kada et al. |
| 6,833,774 B2 | 12/2004 | Abbott et al. |
| 7,009,468 B2 | 3/2006 | Kadota et al. |
| 7,042,132 B2 | 5/2006 | Bauer |
| 7,312,674 B2 | 12/2007 | Duwel et al. |
| 7,345,400 B2 | 3/2008 | Nakao et al. |
| 7,463,118 B2 | 12/2008 | Jacobsen |
| 7,498,904 B2 | 3/2009 | Ohara et al. |
| 7,535,152 B2 | 5/2009 | Ogami et al. |
| 7,554,427 B2 | 6/2009 | Matsumoto |
| 7,684,109 B2 | 3/2010 | Godshalk et al. |
| 7,728,483 B2 | 6/2010 | Tanaka |
| 7,868,519 B2 | 1/2011 | Umeda |
| 7,939,987 B1 | 5/2011 | Solal et al. |
| 7,941,103 B2 | 5/2011 | Iwamoto et al. |
| 7,965,015 B2 | 6/2011 | Tai et al. |
| 8,278,802 B1 | 10/2012 | Lee et al. |
| 8,294,330 B1 | 10/2012 | Abbott et al. |
| 8,344,815 B2 | 1/2013 | Yamanaka et al. |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,112,134 B2 | 8/2015 | Takahashi |
| 9,130,145 B2 | 9/2015 | Martin et al. |
| 9,148,121 B2 | 9/2015 | Inoue |
| 9,154,111 B2 | 10/2015 | Bradley |
| 9,219,466 B2 | 12/2015 | Meltaus et al. |
| 9,240,768 B2 | 1/2016 | Nishihara et al. |
| 9,276,557 B1 | 3/2016 | Nordquist et al. |
| 9,369,105 B1 | 6/2016 | Li et al. |
| 9,425,765 B2 | 8/2016 | Rinaldi |
| 9,525,398 B1 | 12/2016 | Olsson |
| 9,564,873 B2 | 2/2017 | Kadota |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Murata |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,389,391 B2 | 8/2019 | Ito |
| 10,491,192 B1 | 11/2019 | Plesski |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,812,048 B2 | 10/2020 | Nosaka |
| 10,819,309 B1 | 10/2020 | Turner et al. |
| 10,826,462 B2 | 11/2020 | Plesski et al. |
| 10,868,510 B2 | 12/2020 | Yantchev et al. |
| 10,868,512 B2 | 12/2020 | Garcia et al. |
| 10,868,513 B2 | 12/2020 | Yantchev |
| 10,911,017 B2 | 2/2021 | Plesski |
| 10,911,021 B2 | 2/2021 | Turner et al. |
| 10,911,023 B2 | 2/2021 | Turner |
| 10,917,070 B2 | 2/2021 | Plesski et al. |
| 10,917,072 B2 | 2/2021 | McHugh et al. |
| 10,985,726 B2 | 4/2021 | Plesski |
| 10,985,728 B2 | 4/2021 | Plesski et al. |
| 10,985,730 B2 | 4/2021 | Garcia |
| 10,992,282 B1 | 4/2021 | Plesski et al. |
| 10,992,283 B2 | 4/2021 | Plesski et al. |
| 10,992,284 B2 | 4/2021 | Yantchev |
| 10,998,877 B2 | 5/2021 | Turner et al. |
| 10,998,882 B2 | 5/2021 | Yantchev et al. |
| 11,003,971 B2 | 5/2021 | Plesski et al. |
| 11,114,996 B2 | 9/2021 | Plesski et al. |
| 11,114,998 B2 | 9/2021 | Garcia et al. |
| 11,139,794 B2 | 10/2021 | Plesski et al. |
| 11,143,561 B2 | 10/2021 | Plesski |
| 11,146,231 B2 | 10/2021 | Plesski |
| 11,146,232 B2 | 10/2021 | Yandrapalli et al. |
| 11,146,238 B2 | 10/2021 | Hammond et al. |
| 11,146,244 B2 | 10/2021 | Yantchev |
| 11,165,407 B2 | 11/2021 | Yantchev |
| 11,171,629 B2 | 11/2021 | Turner |
| 11,201,601 B2 | 12/2021 | Yantchev et al. |
| 11,323,089 B2 | 5/2022 | Turner |
| 11,368,139 B2 | 6/2022 | Garcia |
| 12,040,779 B2 * | 7/2024 | Garcia ............... H03H 9/02118 |
| 2002/0079986 A1 | 6/2002 | Ruby et al. |
| 2002/0130736 A1 | 9/2002 | Mukai |
| 2002/0158714 A1 | 10/2002 | Kaitila et al. |
| 2002/0189062 A1 | 12/2002 | Lin et al. |
| 2003/0042998 A1 | 3/2003 | Edmonson |
| 2003/0080831 A1 | 5/2003 | Naumenko et al. |
| 2003/0199105 A1 | 10/2003 | Kub et al. |
| 2004/0041496 A1 | 3/2004 | Imai et al. |
| 2004/0100164 A1 | 5/2004 | Murata |
| 2004/0207033 A1 | 10/2004 | Koshido |
| 2004/0207485 A1 | 10/2004 | Kawachi et al. |
| 2004/0261250 A1 | 12/2004 | Kadota et al. |
| 2005/0077982 A1 | 4/2005 | Funasaka |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0131731 A1 | 6/2006 | Sato |
| 2006/0152107 A1 | 7/2006 | Tanaka |
| 2006/0179642 A1 | 8/2006 | Kawamura |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2007/0296304 A1 | 12/2007 | Fujii et al. |
| 2008/0018414 A1 | 1/2008 | Inoue et al. |
| 2008/0246559 A1 | 10/2008 | Ayazi |
| 2008/0297280 A1 | 12/2008 | Thalhammer |
| 2009/0273415 A1 | 11/2009 | Frank |
| 2009/0315640 A1 | 12/2009 | Umeda |
| 2010/0019866 A1 | 1/2010 | Hara et al. |
| 2010/0064492 A1 | 3/2010 | Tanaka |
| 2010/0102669 A1 | 4/2010 | Yamanaka |
| 2010/0123367 A1 | 5/2010 | Tai et al. |
| 2010/0223999 A1 | 9/2010 | Onoe |
| 2010/0301703 A1 | 12/2010 | Chen et al. |
| 2011/0018389 A1 | 1/2011 | Fukano et al. |

(56) References Cited

U.S. PATENT DOCUMENTS

| | | |
|---|---|---|
| 2011/0018654 A1 | 1/2011 | Bradley et al. |
| 2011/0109196 A1 | 5/2011 | Goto et al. |
| 2011/0199163 A1 | 8/2011 | Yamanaka |
| 2011/0278993 A1 | 11/2011 | Iwamoto |
| 2012/0073390 A1 | 3/2012 | Zaghloul et al. |
| 2012/0286900 A1 | 11/2012 | Kadota et al. |
| 2012/0326809 A1 | 12/2012 | Tsuda |
| 2013/0057360 A1 | 3/2013 | Meltaus et al. |
| 2013/0127551 A1 | 5/2013 | Yamanaka |
| 2013/0207747 A1 | 8/2013 | Nishii et al. |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0009247 A1 | 1/2014 | Moriya |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2015/0042417 A1 | 2/2015 | Onodera et al. |
| 2015/0165479 A1 | 6/2015 | Lasiter et al. |
| 2015/0244149 A1 | 8/2015 | Van Someren |
| 2015/0319537 A1 | 11/2015 | Perois et al. |
| 2015/0333730 A1 | 11/2015 | Meltaus et al. |
| 2015/0365067 A1 | 12/2015 | Hori et al. |
| 2016/0028367 A1 | 1/2016 | Shealy |
| 2016/0049920 A1 | 2/2016 | Kishino |
| 2016/0079958 A1 | 3/2016 | Burak |
| 2016/0087187 A1 | 3/2016 | Burak |
| 2016/0149554 A1 | 5/2016 | Nakagawa |
| 2016/0182009 A1 | 6/2016 | Bhattacharjee |
| 2016/0285430 A1 | 9/2016 | Kikuchi et al. |
| 2016/0301382 A1 | 10/2016 | Iwamoto |
| 2017/0063332 A1 | 3/2017 | Gilbert et al. |
| 2017/0104470 A1 | 4/2017 | Koelle et al. |
| 2017/0179225 A1 | 6/2017 | Kishimoto |
| 2017/0179928 A1 | 6/2017 | Raihn et al. |
| 2017/0187352 A1 | 6/2017 | Omura |
| 2017/0201232 A1 | 7/2017 | Nakamura et al. |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0290160 A1 | 10/2017 | Takano et al. |
| 2017/0370791 A1 | 12/2017 | Nakamura et al. |
| 2018/0005950 A1 | 1/2018 | Watanabe |
| 2018/0013400 A1 | 1/2018 | Ito et al. |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1 | 5/2018 | Gong |
| 2018/0152169 A1 | 5/2018 | Goto et al. |
| 2018/0191322 A1 | 7/2018 | Chang et al. |
| 2018/0212589 A1 | 7/2018 | Meltaus et al. |
| 2018/0278227 A1 | 9/2018 | Hurwitz |
| 2018/0316333 A1 | 11/2018 | Nakamura et al. |
| 2019/0068164 A1 | 2/2019 | Houlden et al. |
| 2019/0123721 A1 | 4/2019 | Manufacturing |
| 2019/0131953 A1 | 5/2019 | Gong |
| 2019/0148621 A1 | 5/2019 | Feldman et al. |
| 2019/0181825 A1 | 6/2019 | Schmalzl et al. |
| 2019/0207583 A1 | 7/2019 | Miura et al. |
| 2019/0273480 A1 | 9/2019 | Lin et al. |
| 2019/0305746 A1 | 10/2019 | Ota |
| 2019/0348966 A1 | 11/2019 | Campanella-Pineda |
| 2019/0379351 A1 | 12/2019 | Miyamoto et al. |
| 2019/0386633 A1 | 12/2019 | Plesski |
| 2019/0386635 A1 | 12/2019 | Plesski et al. |
| 2019/0386636 A1 | 12/2019 | Plesski et al. |
| 2019/0386638 A1 | 12/2019 | Kimura et al. |
| 2020/0007110 A1 | 1/2020 | Konaka et al. |
| 2020/0021271 A1 | 1/2020 | Plesski |
| 2020/0021272 A1 | 1/2020 | Segovia Fernandez et al. |
| 2020/0036357 A1 | 1/2020 | Mimura |
| 2020/0228087 A1 | 7/2020 | Michigami et al. |
| 2020/0235719 A1 | 7/2020 | Yantchev et al. |
| 2020/0259480 A1 | 8/2020 | Pensala |
| 2020/0295729 A1 | 9/2020 | Yantchev |
| 2020/0304091 A1 | 9/2020 | Yantchev |
| 2020/0313645 A1 | 10/2020 | Caron |
| 2020/0350891 A1 | 11/2020 | Turner |
| 2021/0013859 A1 | 1/2021 | Turner et al. |
| 2021/0328574 A1 | 10/2021 | Garcia |
| 2022/0116014 A1 | 4/2022 | Poirel |

FOREIGN PATENT DOCUMENTS

| | | |
|---|---|---|
| CN | 210431367 U | 4/2020 |
| JP | H10209804 A | 8/1998 |
| JP | 2001244785 A | 9/2001 |
| JP | 2003078389 A | 3/2003 |
| JP | 2004096677 A | 3/2004 |
| JP | 2004129222 A | 4/2004 |
| JP | 2004304622 A | 10/2004 |
| JP | 2006173557 A | 6/2006 |
| JP | 2007251910 A | 9/2007 |
| JP | 2010103803 A | 5/2010 |
| JP | 2010233210 A | 10/2010 |
| JP | 2013528996 A | 7/2013 |
| JP | 2013214954 A | 10/2013 |
| JP | 2015054986 A | 3/2015 |
| JP | 2016001923 A | 1/2016 |
| JP | 2018093487 A | 6/2018 |
| JP | 2018166259 A | 10/2018 |
| JP | 2018207144 A | 12/2018 |
| JP | 2019186655 A | 10/2019 |
| JP | 2020113939 A | 7/2020 |
| WO | 2010047114 A1 | 4/2010 |
| WO | 2015098694 A1 | 7/2015 |
| WO | 2016017104 | 2/2016 |
| WO | 2016052129 A1 | 4/2016 |
| WO | 2016147687 A1 | 9/2016 |
| WO | 2017188342 A1 | 11/2017 |
| WO | 2018003273 | 1/2018 |
| WO | 2018163860 A1 | 9/2018 |
| WO | 2019138810 A1 | 7/2019 |
| WO | 2020092414 A2 | 5/2020 |
| WO | 2020100744 A1 | 5/2020 |

OTHER PUBLICATIONS

Pang et al., "Self-Aligned Lateral Field Excitation Film Acoustic Resonator with Very Large Electromechanical Coupling," IEEE International Ultrasonics, Ferroelectrics, and Frequency Control Joint 50th Anniversary Conference, Aug. 2004, pp. 558-561.

Yandrapalli et al., "Toward Band n78 Shear Bulk Acoustic Resonators Using Crystalline Y-Cut Lithium Niobate Films With Spurious Suppression," Journal of Microelectromechanical System, Aug. 2023, vol. 32, No. 4, pp. 327-334.

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Buchanan "Ceramic Materials for Electronics" 3rd Edition, first published in 2004 by Marcel Dekker, Inc. pp. 496 (Year 2004). Jan. 00, 2004.

Ekeom, D. & Dubus, Bertrand & Volatier, A . . . (2006). Solidly mounted resonator (SMR) FEM-BEM simulation. 1474-1477. 10.1109/ULTSYM.2006.371.

G. Manohar, "Investigation of Various Surface Acoustic Wave Design Configurations for Improved Sensitivity." Doctoral dissertation, University of South Florida, USA, Jan. 2012, 7 pages.

(56) References Cited

OTHER PUBLICATIONS

Kadota et al. "5.4 Ghz Lamb Wave Resonator on LiNbO3 Thin Crystal Plate and its Application," published in Japanese Journal of Applied Physics 50 (2011) 07HD11. (Year: 2011) 2011.
M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.
Material Properties of Tibtech Innovations, © 2018 TIBTECH Innovations (Year 2018). 2018.
Merriam Webster, dictionary meaning of the word "diaphragm", since 1828, Merriam Webster (Year: 1828) 1828.
Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406.
Moussa et al. Review on Triggered Liposomal Drug Delivery with a Focus on Ultrasound 2015, Bentham Science Publishers, pp. 16 (Year 2005) 2005.
Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.
Naumenko et al., "Optimal orientations of Lithium Niobate for resonator SAW filters", 2003 IEEE Ultrasonics Symposium—pp. 2110-2113. (Year: 2003).
R. Olsson III, K. Hattar et al. "A high electromechanical coupling coefficient SHO Lamb wave lithiumniobate micromechanical resonator and a method for fabrication" Sensors and Actuators A: Physical, vol. 209, Mar. 1, 2014, pp. 183-190.
Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.
Safari et al. "Piezoelectric for Transducer Applications" published by Elsevier Science Ltd., pp. 4 (Year: 2000). 2020.
Santosh, G. , Surface acoustic wave devices on silicon using patterned and thin film ZnO, Ph.D. thesis, Feb. 2016, Indian Institute of technology Guwahati, Assam, India Feb. 2016.
Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) Jan. 00, 2015.
T. Takai, H. Iwamoto, et al., "I.H.P.Saw Technology and its Application to Microacoustic Components (Invited)." 2017 EEE International Ultrasonics Symposium, Sep. 6-9, 2017. pp. 1-8.
USPTO/ISA, International Search Report and Written Opinion for PCT Application No. PCT/US2019/036433 dated Aug. 29, 2019.
USPTO/ISA, International Search Report and Written Opinion for PCT Application No. PCT/US2019/058632 dated Jan. 17, 2020.
USPTO/ISA, International Search Report and Written Opinion for PCT Application No. PCT/US2020/45654 dated Oct. 29, 2020.
USPTO/ISA, International Search Report and Written Opinion for PCT Application No. PCT/US2021/024824 dated Jul. 27, 2021, 9 total pages.
USPTO/ISA, International Search Report and Written Opinion for PCT Application No. PCT/US2021/048505 dated Dec. 1, 2021, 11 total pages.
Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.
Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.
Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.
Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.
Zou, Jie "High-Performance Aluminum Nitride Lamb Wave Resonators for RF Front-End Technology" University of California, Berkeley, Summer 2015, pp. 63 (Year 2015) Jan. 00, 2015.
Chen et al., "Development and Application of SAW Filter," Micromachines, Apr. 20, 2022, vol. 13, No. 656, pp. 1-15.
Hermann et al., "Properties of shear-horizontal surface acoustic waves in different layered quartz-SiO2 structures," Ultrasonics, 1999, vol. 37, pp. 335-341.

* cited by examiner

HIGH Q SOLIDLY-MOUNTED TRANSVERSELY-EXCITED FILM BULK ACOUSTIC RESONATORS

RELATED APPLICATION INFORMATION

This application is continuation-in-part of application Ser. No. 17/555,349, filed Dec. 17, 2021, entitled LOW LOSS TRANSVERSELY-EXCITED FILM BULK ACOUSTIC RESONATORS AND FILTERS, which claims priority to provisional patent application 63/196,645, filed Jun. 3, 2021, entitled XBAR N79 FILTER GRATING ELEMENTS. Application Ser. No. 17/555,349 is also a continuation-in-part of application Ser. No. 17/229,767, filed Apr. 13, 2021, entitled SMALL TRANSVERSELY-EXCITED FILM BULK ACOUSTIC RESONATORS WITH ENHANCED Q-FACTOR, which claims priority to the following provisional patent applications: application No. 63/012,849, filed Apr. 20, 2020, entitled SMALL HIGH Q XBAR RESONATORS; application No. 63/066,520, filed Aug. 17, 2020, entitled SMALL REFLECTORS TO IMPROVE XBAR LOSS; and application No. 63/074,991, filed Sep. 4, 2020, entitled SMALL REFLECTORS TO IMPROVE PERFORMANCE OF TRANSVERSELY-EXCITED FILM BULK ACOUSTIC RESONATORS AT A SPECIFIED FREQUENCY. All of these applications are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP (3$^{rd}$ Generation Partnership Project). Radio access technology for 5$^{th}$ generation (5G) mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in patent U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

A solidly-mounted transversely-excited film bulk acoustic resonator (SM-XBAR) is an acoustic resonator structure similar to an XBAR except that the thin piezoelectric layer is on an acoustic Bragg reflector rather than floating. SM-XBAR is described in U.S. Pat. No. 10,601,392, titled SOLIDLY-MOUNTED TRANSVERSELY-EXCITED FILM BULK ACOUSTIC RESONATOR.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
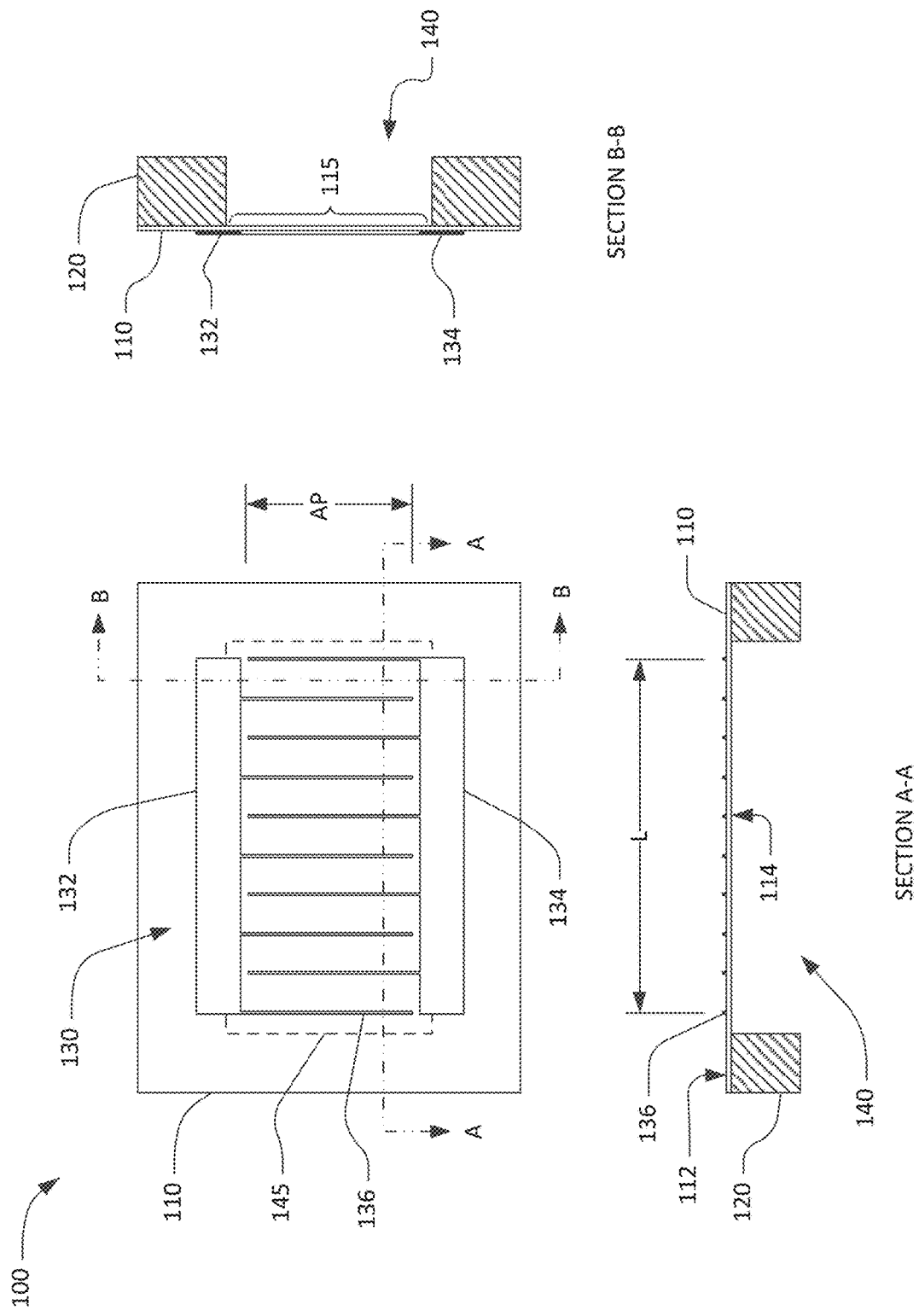
FIG. 1 includes a schematic plan view and schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100 as described in application Ser. No. 16/230,443, TRANSVERSELY-EXCITED FILM BULK ACOUSTIC RESONATOR. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the surfaces. However, XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The piezoelectric plate 110 may be bonded to the substrate 120 using a wafer bonding process, or grown on the substrate 120, or attached to the substrate in some other manner. The piezoelectric plate may be attached directly to the substrate or may be attached to the substrate via one or more intermediate material layers.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites an acoustic wave within the piezoelectric plate 110. As will be discussed in further detail, the excited acoustic wave is a bulk shear wave that propagates in the direction normal to the surface of the piezoelectric plate 110, which is also normal, or transverse, to the direction of the electric field created by the IDT fingers. Thus, the XBAR is considered a transversely-excited film bulk wave resonator.

A cavity 140 is formed in the substrate 120 such that the portion of the piezoelectric plate 110 containing the IDT 130 is suspended over the cavity 140 without contacting the substrate 120. "Cavity" has its conventional meaning of "an empty space within a solid body." The cavity 140 may be a hole completely through the substrate 120 (as shown in Section A-A and Section B-B) or a recess in the substrate 120. The cavity 140 may be formed, for example, by selective etching of the substrate 120 before or after the piezoelectric plate 110 and the substrate 120 are attached. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may have more or fewer than four sides, which may be straight or curved.

A portion of the piezoelectric plate 110 forms a diaphragm 115 spanning the cavity 140. The fingers of the IDT are wholly or partially on the diaphragm.

For ease of presentation in FIG. 1, the geometric pitch and width of the IDT fingers are greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
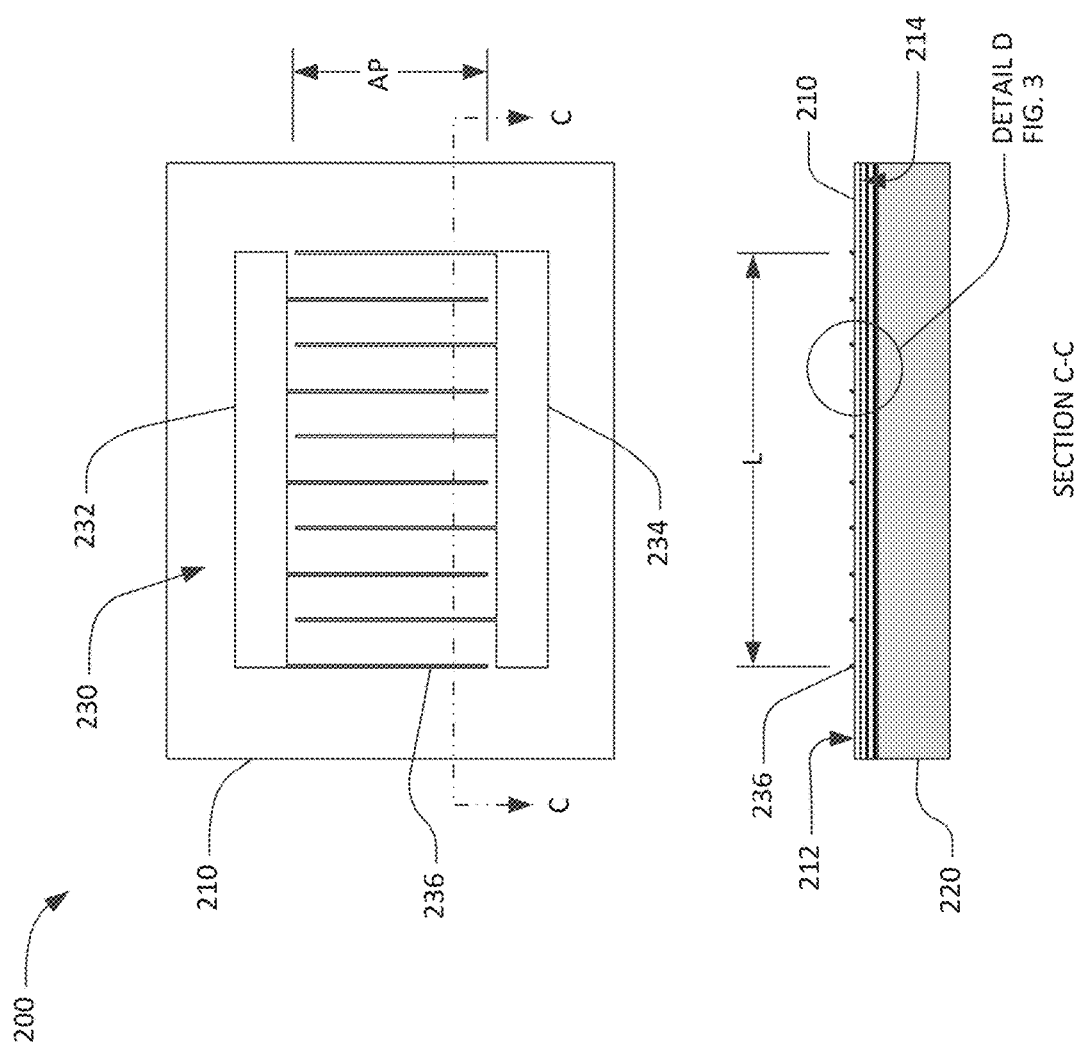
FIG. 2 includes a schematic plan view and a schematic cross-sectional view of a solidly-mounted transversely-excited film bulk acoustic resonator (SM XBAR).

FIG. 2 shows a simplified schematic top view and an orthogonal cross-sectional view of a solidly-mounted transversely-excited film bulk acoustic resonator (SM XBAR) 200. SM XBAR resonators such as the resonator 200 may be used in a variety of RF filters including band-reject filters, band-pass filters, duplexers, and multiplexers. SM XBARs are particularly suited for use in filters for communications bands with frequencies above 3 GHz.

The SM XBAR 200 is made up of a thin film conductor pattern formed on a front surface 212 of a piezoelectric plate 210 having parallel front and back surfaces 212, 214, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate 210 may be Z-cut, rotated Z-cut, or rotated Y-cut lithium niobate or lithium tantalate. SM XBARs may be fabricated on piezoelectric plates with other crystallographic orientations.

The back surface 214 of the piezoelectric plate 210 is attached to, and mechanically supported by, a substrate 220. The substrate 220 may be, for example, silicon, sapphire, quartz, or some other material. As will be described subsequently, the piezoelectric plate 210 may be attached to the substrate 220 via a plurality of intermediate material layers.

The conductor pattern of the SM XBAR 200 includes an interdigital transducer (IDT) 230. The IDT 230 includes a first plurality of parallel fingers, such as finger 236, extending from a first busbar 232 and a second plurality of fingers extending from a second busbar 234. The first and second pluralities of parallel fingers are interleaved. The interleaved fingers overlap for a distance AP, commonly referred to as the "aperture" of the IDT. The center-to-center distance L between the outermost fingers of the IDT 230 is the "length" of the IDT.

The first and second busbars 232, 234 serve as the terminals of the SM XBAR 200. A radio frequency or microwave signal applied between the two busbars 232, 234 of the IDT 230 excites an acoustic wave within the piezoelectric plate 210. As will be discussed in further detail, the excited acoustic wave is a bulk shear wave that propagates in the direction normal to the surface of the piezoelectric plate 210, which is also normal, or transverse, to the direction of the electric field created by the IDT fingers. Thus, the SM XBAR is considered a transversely-excited film bulk wave resonator.

For ease of presentation in FIG. 2, the geometric pitch and width of the IDT fingers are greatly exaggerated with respect to the length (dimension L) and aperture (dimension AP) of the SM XBAR. A typical SM XBAR has more than ten parallel fingers in the IDT 210. An SM XBAR may have hundreds, possibly thousands, of parallel fingers in the IDT 210. Similarly, the thickness of the fingers in the cross-sectional views is greatly exaggerated.

Figure 3:
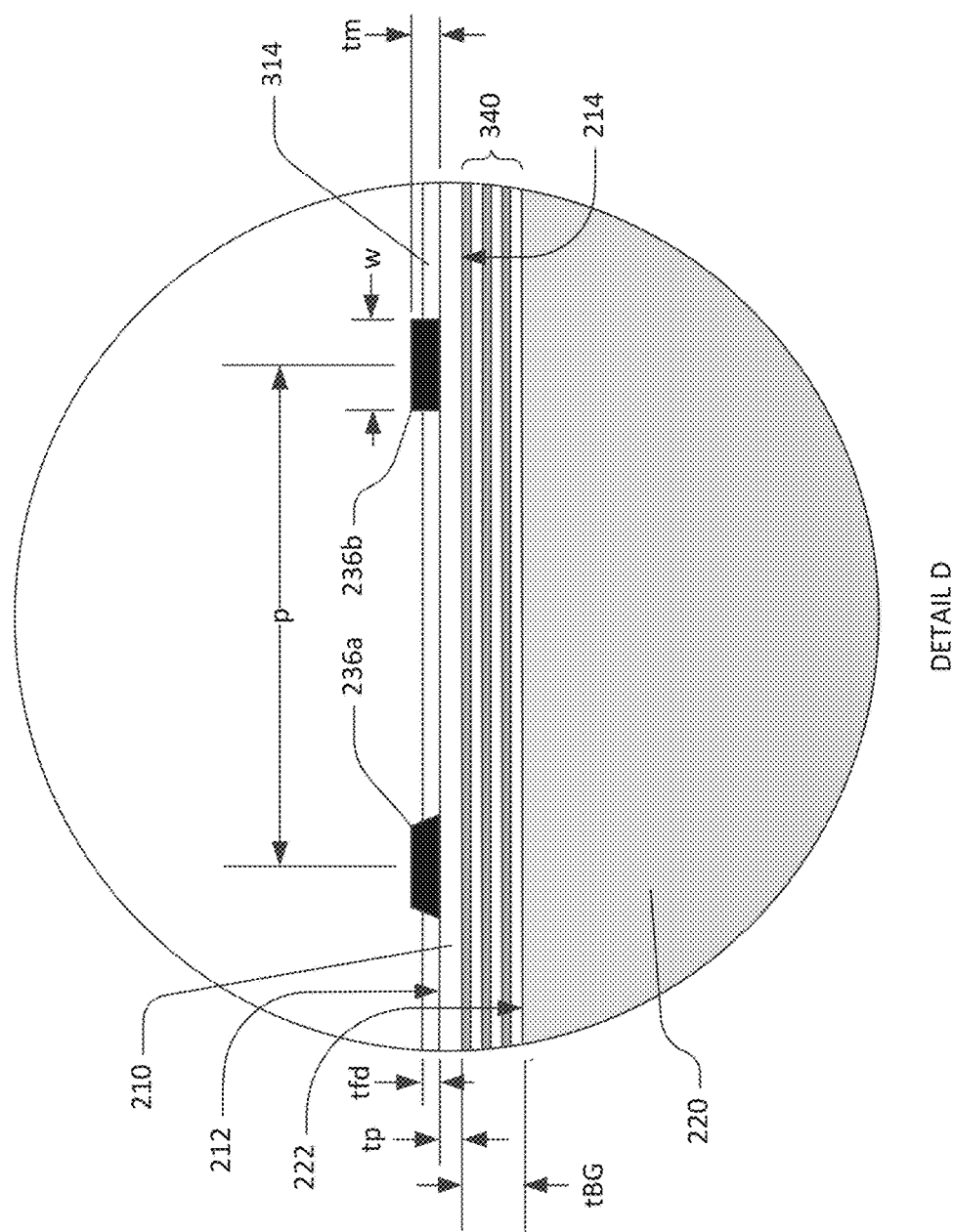
FIG. 3 is an expanded schematic cross-sectional view of a portion of the SM XBAR of FIG. 2.

FIG. 3 shows a detailed schematic cross-sectional view of the SM XBAR 200. The piezoelectric plate 210 is a single-crystal layer of piezoelectrical material, as previously described, having a thickness tp. tp may be, for example, 50 nm to 1500 nm.

A front-side dielectric layer 314 may optionally be formed on the front surface 212 of the piezoelectric plate 210. The front-side dielectric layer 314 has a thickness tfd. The front-side dielectric layer 314 may be formed between the IDT fingers 236a, 236b. Although not shown in FIG. 3, the front side dielectric layer 314 may also be deposited over the IDT fingers 236a, 236b. The front-side dielectric layer 314 may be a non-piezoelectric dielectric material, such as silicon dioxide or silicon nitride. tfd may be, for example, 0 to not more than 30% of the thickness tp of the piezoelectric plate 210.

The IDT fingers 236a, 236b may be aluminum or a substantially aluminum alloy, copper or a substantially copper alloy, beryllium, molybdenum, gold, or some other conductive material. Thin (relative to the total thickness of the conductors) layers of other metals, such as chromium or titanium, may be formed under and/or over the fingers to improve adhesion between the fingers and the piezoelectric plate 210 and/or to passivate or encapsulate the fingers. The busbars (232, 234 in FIG. 2) of the IDT may be made of the same or different materials as the fingers. The cross-sectional shape of the IDT fingers may be trapezoidal (e.g. IDT finger 236a) or rectangular (e.g. IDT finger 236b), or some other shape (not shown).

Dimension p is the center-to-center spacing or "pitch" of the IDT fingers, which may be referred to as the pitch of the IDT and/or the pitch of the SM XBAR. Dimension w is the width or "mark" of the IDT fingers. The IDT of an SM XBAR differs substantially from the IDTs used in surface acoustic wave (SAW) resonators. In a SAW resonator, the pitch of the IDT is one-half of the acoustic wavelength at the resonance frequency. Additionally, the ratio of the finger width to the pitch of a SAW resonator IDT is typically close to 0.5 (i.e. the finger width w is about one-fourth of the acoustic wavelength at resonance). In an SM XBAR, the width w of the IDT fingers is typically 0.2 to 0.3 times the pitch p of the IDT.

The center-to-center spacing of the IDT fingers and/or the width of the IDT fingers may vary along the length of the IDT. For example, varying the center-to-center spacing and/or the width of the IDT fingers may suppress undesired spurious acoustic modes. In such cases, the dimensions p and w are defined to be the average value of the center-to-center spacing and width, respectively.

The pitch p of the IDT may be 2 to 20 times the thickness tp of the piezoelectric plate 210. The pitch p of the IDT may typically be 5 to 12.5 times tp. The thickness tm of the IDT fingers 236a, 236b is typically 0.8 to 1.5 times the thickness tp of the piezoelectric plate 210. The thickness of the busbars (232, 234 in FIG. 2) of the IDT may be the same as, or greater than, the thickness tm of the IDT fingers.

An acoustic Bragg reflector 340 is sandwiched between a surface 222 of the substrate 220 and the back surface 214 of the piezoelectric plate 110. The term "sandwiched" means the acoustic Bragg reflector 340 is both disposed between and physically connected to the surface 222 of the substrate 220 and the back surface 214 of the piezoelectric plate 210. In some circumstances, thin layers of additional materials may be disposed between the acoustic Bragg reflector 340 and the surface 222 of the substrate 220 and/or between the Bragg reflector 340 and the back surface 214 of the piezoelectric plate 210. Such additional material layers may be present, for example, to facilitate bonding the piezoelectric plate 210, the acoustic Bragg reflector 340, and the substrate 220.

The acoustic Bragg reflector 340 includes multiple layers that alternate between materials having high acoustic impedance and materials have low acoustic impedance. "High" and "low" are relative terms. For each layer, the standard for comparison is the adjacent layers. Each "high" acoustic impedance layer has an acoustic impedance higher than that of both the adjacent low acoustic impedance layers. Each "low" acoustic impedance layer has an acoustic impedance lower than that of both the adjacent high acoustic impedance layers. Each of the layers has a thickness equal to, or about, one-fourth of the acoustic wavelength at or near a resonance frequency of the SM XBAR 200. All of the high acoustic impedance layers of the acoustic Bragg reflector 340 are not necessarily the same material, and all of the low acoustic impedance layers are not necessarily the same material.

Dielectric materials having comparatively low acoustic impedance include silicon dioxide, silicon oxycarbide, and certain plastics such as cross-linked polyphenylene polymers. Dielectric materials having comparatively high acoustic impedance include silicon nitride, aluminum nitride, silicon carbide, diamond, diamond-like carbon (DLC), cubic boron nitride (c-BN), and hafnium oxide. Aluminum has comparatively low acoustic impedance and other metals such as molybdenum, tungsten, gold, and platinum have comparatively high acoustic impedance. However, the presence of metal layers in the acoustic Bragg reflector 340 will distort the electric field generated by the IDT fingers and substantially reduce the electromechanical coupling of the SM XBAR. Thus, all of the layers of the acoustic Bragg reflector 340 may be dielectric materials.

In the example of FIG. 3, the acoustic Bragg reflector 340 has a total of six layers or three pairs of layers. An acoustic Bragg reflector may have more than, or less than, six layers.

Figure 4:
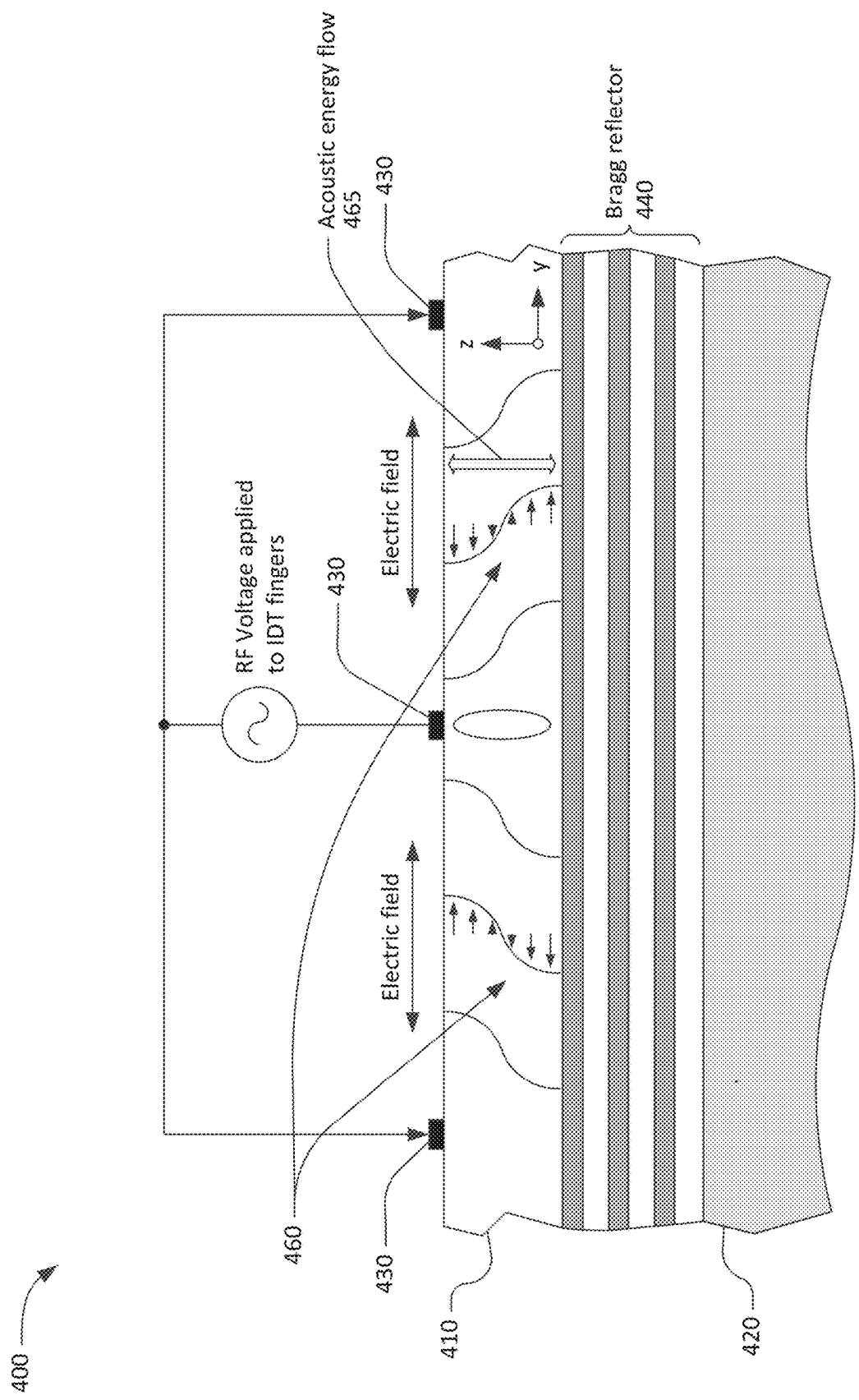
FIG. 4 is a graphic illustrating a shear primary acoustic mode in an SM XBAR.

FIG. 4 is a graphical illustration of the primary acoustic mode in a SM XBAR 400. FIG. 4 shows a small portion of the SM XBAR 400 including a piezoelectric plate 410 and three interleaved IDT fingers 430. The piezoelectric plate 410 may be single-crystal lithium niobate cut such that the z-axis is normal to the surfaces of the plate. The IDT fingers may be oriented parallel to the x-axis of the plate such that the y-axis is normal to the fingers.

An RF voltage applied to the interleaved fingers 430 creates a time-varying electric field between the fingers. In the regions between the IDT fingers 430, the direction of the electric field is predominantly lateral, or parallel to the surface of the piezoelectric plate 410, and orthogonal to the length of the IDT fingers, as indicated by the dashed arrows labeled "electric field". Due to the high dielectric constant of the piezoelectric plate, the electric field is highly concentrated in the plate relative to the air. The lateral electric field excites acoustic waves in the piezoelectric plate 410. In an XBAR, the piezoelectric plate and the IDT are configured such that the lateral electric field causes shear deformation, and thus strongly excites shear-mode acoustic waves, in the piezoelectric plate 410. In this context, "shear deformation" is defined as deformation in which parallel planes in a material remain parallel and maintain a constant distance while translating relative to each other. "Shear acoustic waves" are defined as acoustic waves in a medium that result in shear deformation of the medium. The shear deformations in the piezoelectric plate 410 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the primary shear acoustic mode is substantially orthogonal to the surface of the piezoelectric plate, as indicated by the arrow 465. Other secondary or spurious acoustic modes may also be excited in addition to the primary shear acoustic mode.

An acoustic Bragg reflector 440 is sandwiched between the piezoelectric plate 410 and a substrate 420. The acoustic Bragg reflector 440 reflects the acoustic waves of the primary acoustic mode to keep the acoustic energy (arrow 465) predominantly confined to the piezoelectric plate 410. The acoustic Bragg reflector 440 for an XBAR consists of alternating layers of materials having relatively high and relatively low acoustic impedance, with each layer having a thickness of about one-quarter of the wavelength of the shear acoustic waves (arrow 465) at resonance frequency of the XBAR 400. In the example of FIG. 4, the acoustic Bragg reflector 440 has a total of six layers. An acoustic Bragg reflector may have more than, or less than, six layers.

Figure 5:
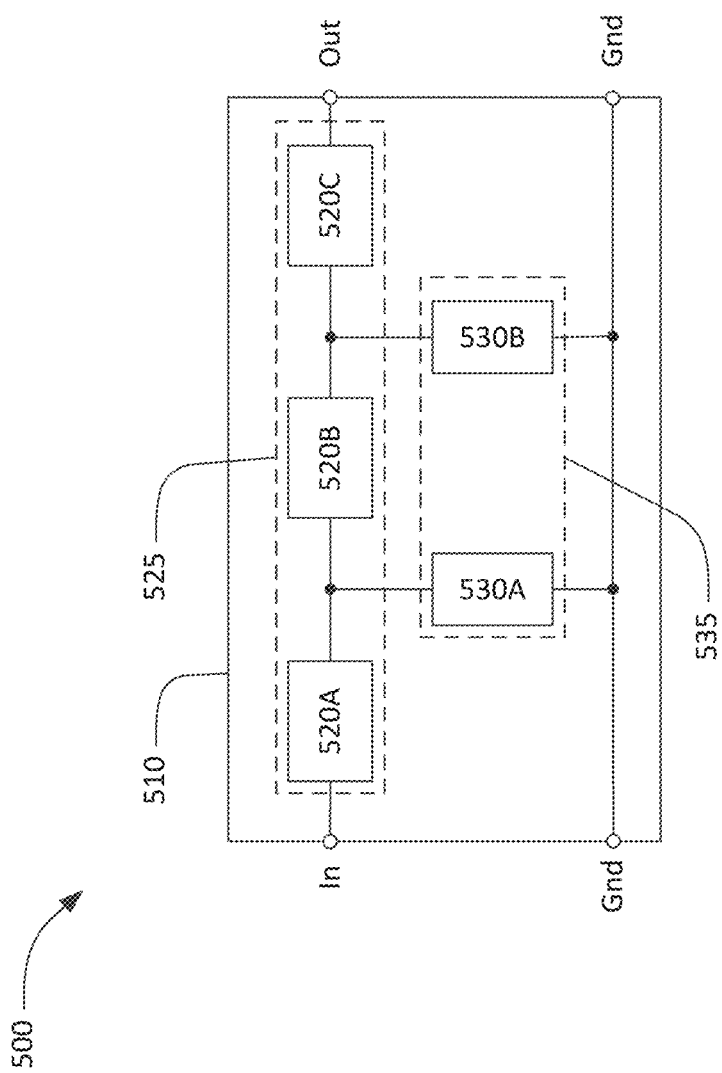
FIG. 5 is a schematic block diagram of a bandpass filter incorporating five SM XBARs.

FIG. 5 is a schematic circuit diagram for a high frequency band-pass filter 500 using SM XBARs. The filter 500 has a conventional ladder filter architecture including three series resonators 520A, 520B, 520C and two shunt resonators 530A, 530B. The three series resonators 520A, 520B, 520C are connected in series between a first port and a second port. In FIG. 5, the first and second ports are labeled "In" and "Out", respectively. However, the filter 500 is bidirectional and either port and serve as the input or output of the filter. The two shunt resonators 530A, 530B are connected from nodes between the series resonators to ground. The architecture of the filter 500 is commonly referred to as a "ladder filter circuit". All the shunt resonators and series resonators of the filter 500 are SM XBARs. Although not shown in FIG. 5, some or all of the resonators may be divided into multiple sub-resonators electrically connected in parallel.

The filter 500 may include a substrate having a surface, a single-crystal piezoelectric plate having front and back surfaces, and an acoustic Bragg reflector sandwiched between the surface of the substrate and the back surface of the piezoelectric plate. The substrate, acoustic Bragg reflector, and piezoelectric plate are represented by the rectangle 510 in FIG. 5. A conductor pattern formed on the front surface of the single-crystal piezoelectric plate includes interdigital transducers (IDTs) for each of the three series resonators 520A, 520B, 520C and two shunt resonators 530A, 530B. The conductor pattern includes conductors to interconnect the resonators in the ladder filter circuit. All of the IDTs are configured to excite shear acoustic waves in the single-crystal piezoelectric plate in response to respective radio frequency signals applied to each IDT.

In a ladder filter circuit, such as the filter 500, the resonance frequencies of shunt resonators are typically lower than the resonance frequencies of series resonators. The resonance frequency of an SM XBAR resonator is primarily determined by the thickness of the piezoelectric plate and dielectric layers, if present, above the acoustic Bragg reflector. Resonance frequency also determined, to a lesser extent, by IDT pitch and finger width. IDT pitch and finger width also impact other filter parameters including impedance and power handling capability. For broad-band filter applications, it may not be practical to provide the required difference between the resonance frequencies of shunt and series resonators using only differences in IDT pitch and/or finger width.

As described in U.S. Pat. No. 10,601,392, a first dielectric layer (represented by the dashed rectangle 535) having a first thickness t1 may be deposited over the IDTs of some or all of the shunt resonators 530A, 530B. A second dielectric layer (represented by the dashed rectangle 525) having a second thickness t2, less than t1, may be deposited over the IDTs of the series resonators 520A, 520B, 520C. The second dielectric layer may be deposited over both the shunt and series resonators. The difference between the thickness t1 and the thickness t2 defines a frequency offset between the series and shunt resonators. Individual series or shunt resonators may be tuned to different frequencies by varying the pitch of the respective IDTs. In some filters, more than two dielectric layers of different thicknesses may be used as described in co-pending application Ser. No. 16/924,108.

Alternatively or additionally, the shunt resonators 530A, 530B may be formed on portions of the piezoelectric plate having a thickness t3 and the series resonators 520A, 520B, 520C may be fabricated on portions of the piezoelectric plate having a thickness t4 less than t3. The difference between the thicknesses t3 and t4 defines a frequency offset between the series and shunt resonators. Individual series or shunt resonators may be tuned to different frequencies by varying the pitch of the respective IDTs. In some filters, three or more different piezoelectric plate thicknesses may be used to provide additional frequency tuning capability.

The filter 500 is exemplary. Filters may contain more or fewer than five total resonators, more than two shunt resonators, and more or fewer than three series resonators. Filters may include shunt resonators connected from one or both of the input port and the output port to ground. Filters may contain additional reactive components, such as inductors and capacitors, not shown in FIG. 5.

The Q-factor, also called the Bode Q factor, of an acoustic resonator is commonly defined as the peak energy stored during a cycle of an applied RF signal divided by the total energy dissipated or lost during the cycle. The Q-factor of an SM XB AR is a complex function of numerous parameters including the length and aperture of the IDT and the thickness of the conductor pattern.

Possible loss mechanisms in an acoustic resonator include resistive losses in the IDT and other conductors; viscous or acoustic losses in the piezoelectric plate, IDT fingers, and other materials; and leakage of acoustic energy out of the resonator structure. The peak energy stored in a resonator is proportional to the capacitance of the resonator. In an XBAR resonator, the capacitance is proportional to the number of IDT fingers. Resistive losses and viscose losses are also proportional to the number of IDT fingers. Acoustic energy that leaks from the resonator in the transverse direction (i.e. the direction parallel to the IDT fingers) is proportional to the length of the resonator and thus also proportional to the number of IDT fingers. In contrast, energy lost from the ends of the IDT in the longitudinal direction (i.e. the direction normal to the IDT fingers) is proportional to the aperture of the IDT and roughly independent of the number of IDT fingers.

Application Ser. No. 17/555,349 describes that energy losses in the longitudinal direction can be reduced by the presence of reflector elements at the ends of the IDT. The reflector elements are conductors parallel to the first and last IDT fingers. The center-to-center spacing of the reflector elements is greater than the pitch p of the IDT. The center-to-center spacing of the reflector elements is typically greater than or equal to 1.2 p and less than or equal to 1.5 p. The presence of one reflector element at each end of the IDT provides an improvement in resonator Q factor. Two reflector elements at each end provide further improvement and five reflector elements at each end of the IDT provide little or no improvement compared to two elements.

The width of the reflector elements is not necessarily the same and may be selected to maximize the Q factor of an SM XBAR at a particular frequency. For example, if the SM XBAR is a shunt resonator in a ladder bandpass filter circuit, such as the filter 500 of FIG. 5, having a pass-band, with the width of the reflector elements selected to improve a Q-factor of the device at a lower edge of the pass-band. If the SM XBAR is a series resonator in a ladder bandpass filter circuit having a passband, the width of the reflector elements may be selected to improve a Q-factor of the device at an upper edge of the pass-band.

Figure 6:
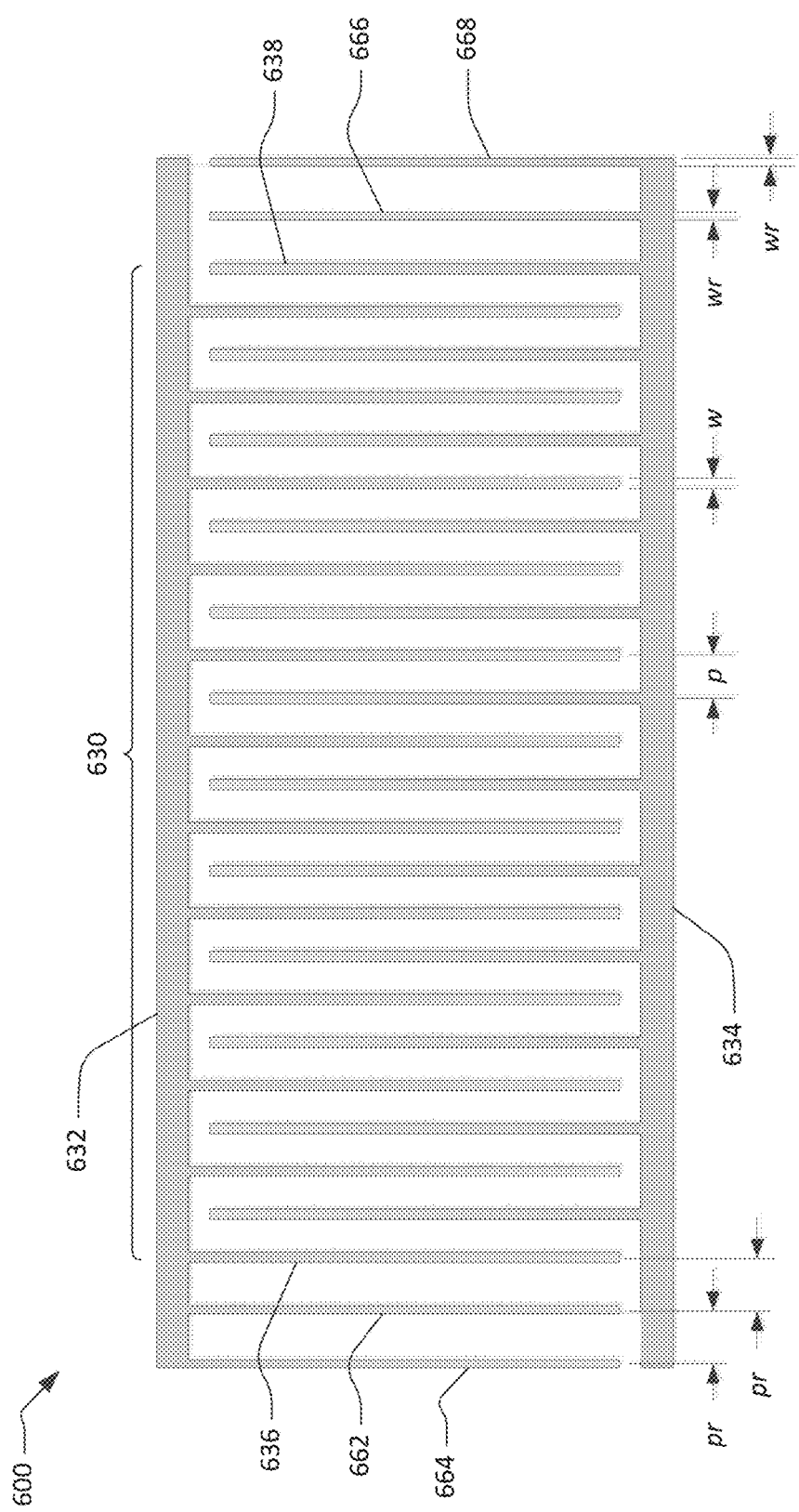
FIG. 6 is a schematic plan view of an IDT with reflector elements.

FIG. 6 is a plan view of an exemplary conductor pattern 600 that reduces the acoustic energy leakage in the longitudinal direction at the ends of an XBAR. The conductor pattern 600 includes an IDT 630 and four reflector elements 662, 664, 666, 668. The IDT 630 includes a first busbar 632, a second busbar 634, and a plurality of n interleaved IDT fingers extending alternately from the first and second busbars. In this example, n, the number of IDT fingers, is equal to 24. In other XBARs, n may be in a range from 20 to 100 or more IDT fingers. IDT finger 636 is the $1^{st}$ finger and IDT finger 638 is the n'th finger. Numbering the IDT fingers from left to right (as shown in FIG. 6) is arbitrary and the designations of the $1^{st}$ and n'th fingers could be reversed.

As shown in FIG. 6, the odd numbered IDT fingers extend from the first busbar 632 and the even numbered IDT fingers extend from the second busbar 634. The IDT 630 has an even number of IDT fingers such that the $1^{st}$ and n'th IDT fingers 636, 638 extend from different busbars. In some cases, an IDT may have an odd number of IDT fingers such that the $1^{st}$ and n'th IDT fingers and all of the reflector elements extend from the same busbar.

A total of four reflector elements are provided outside of periphery of the IDT 630. A first reflector element 662 is proximate and parallel to 1st IDT finger 636 at the left end of the IDT 630. A second reflector element 666 is proximate and parallel to n'th IDT finger 638 at the right end of the IDT 630. An optional third reflector element 664 is parallel to the first reflector element 662. An optional fourth reflector element 668 is parallel to the second reflector element 666.

First and third reflector elements 662, 664 extend from the first busbar 632 and thus are at the same electrical potential as the 1st IDT finger 636. Similarly, second and fourth reflector elements 666 and 668 extend from the second busbar 630 and thus are at the same electrical potential as the n'th IDT finger 638.

The reflector elements 662, 664, 666, 668 are configured to confine acoustic energy to the area of the IDT 630 and thus reduce acoustic energy losses in the longitudinal direction. To this end, the pitch pr between adjacent reflector elements and between reflector elements 662 and 666 and the adjacent first and n'th IDT fingers, respectively, is typically greater than the pitch p of the IDT fingers. The width wr of the reflector elements 662, 664, 666, 668 is not necessarily equal to the width w of the IDT fingers. As will be described subsequently, the width wr of the reflector elements may be selected to optimize Q-factor at a specific frequency or range of frequencies.

Figure 7:
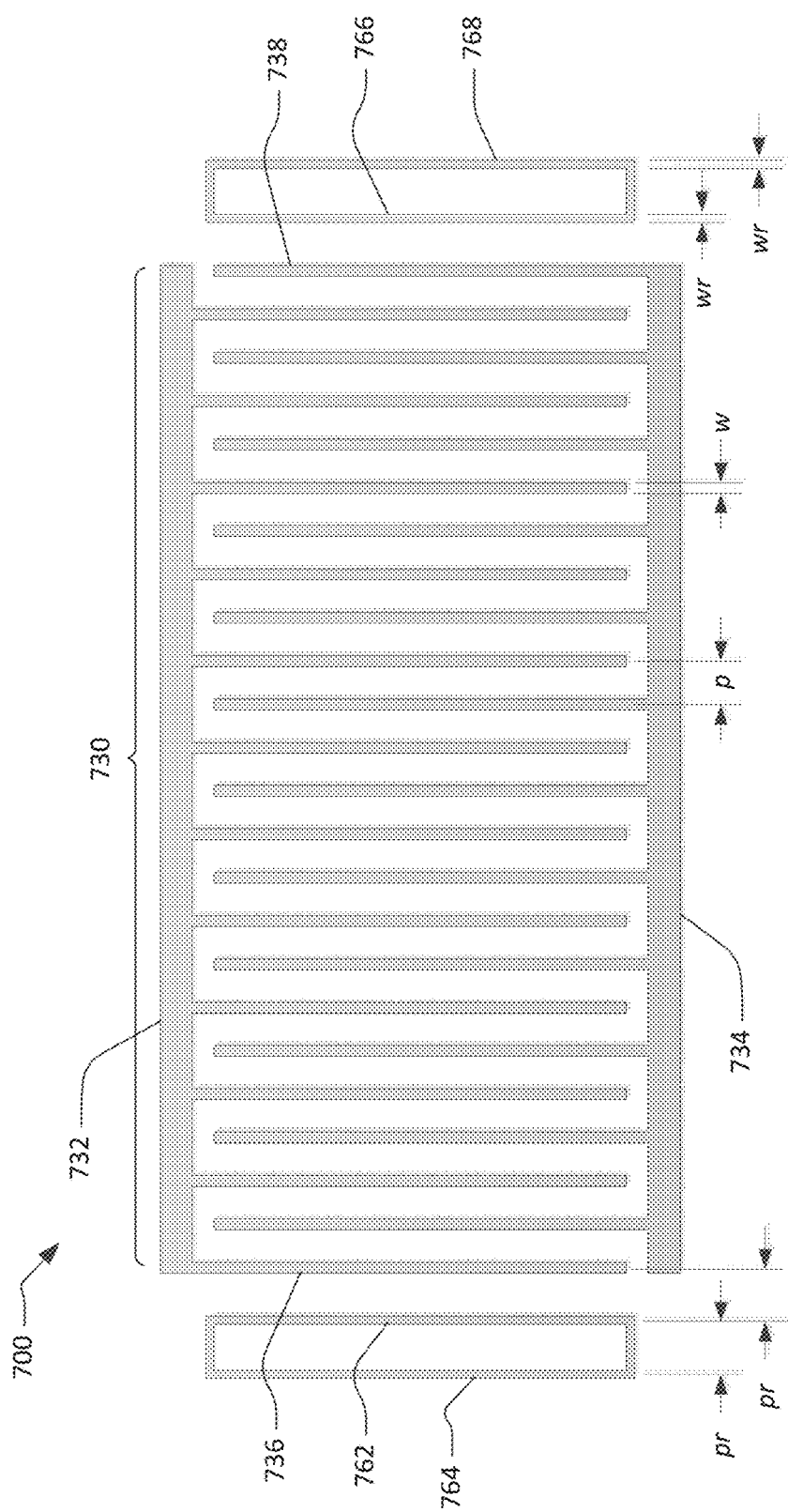
FIG. 7 is a schematic plan view of another IDT with reflector elements.

FIG. 7 is a plan view of another conductor pattern 700 that reduces the acoustic energy leakage in the longitudinal direction at the ends of an XBAR. The conductor pattern 700 includes an IDT 730 and four reflector elements 762, 764, 766, 768. The IDT 730 includes a first busbar 732, a second busbar 734, and a plurality of interleaved IDT fingers extending alternately from the first and second busbars as previously described. IDT fingers 736 and 738 are the $1^{st}$ and n'th IDT fingers at the left and right (as shown in FIG. 7) ends of the IDT 730, respectively.

A total of four reflector elements are provided outside of periphery of the IDT 730. First and third reflector elements 762 and 764 are proximate and parallel to $1^{st}$ IDT finger 736 at the left end of the IDT 730. Second and fourth reflector elements 762, 764 are connected to each other but are not connected to either busbar 732, 734. First and third reflector elements 762, 764 are capacitively coupled to $1^{st}$ IDT finger 736 and thus are at substantially the same electrical potential as the $1^{st}$ IDT finger 736. The reflector elements are considered to be at substantially the same potential if, when an RF signal is applied between the busbars 732, 734, the potential between the reflector elements and the 1$^{st}$ IDT finger is small compared to the potential between adjacent IDT fingers.

Similarly, second and fourth reflector elements 766 and 768 are proximate and parallel to n'th IDT finger 738 at the right end of the IDT 730. Second and fourth reflector elements 766, 768 are connected to each other and not connected to each other or either busbar 732, 734. Second and fourth reflector elements 766, 768 are capacitively coupled to each other and to n'th IDT finger 738 and thus are at nearly the same electrical potential as the n'th IDT finger 738.

The reflector elements 762, 764, 766, 768 are configured to confine acoustic energy to the area of the IDT 730 and thus reduce acoustic energy lost in the longitudinal direction. To this end, the pitch pr between adjacent reflector elements and between reflector elements 762 and 766 and the adjacent terminal IDT fingers is typically greater than the pitch p of the IDT fingers. The width wr of the reflector elements 762, 764, 766, 768 is not necessarily equal to the width w of the IDT fingers. The width wr of the reflector elements may be selected to optimize Q-factor for a particular frequency of range of frequencies.

Figure 8:
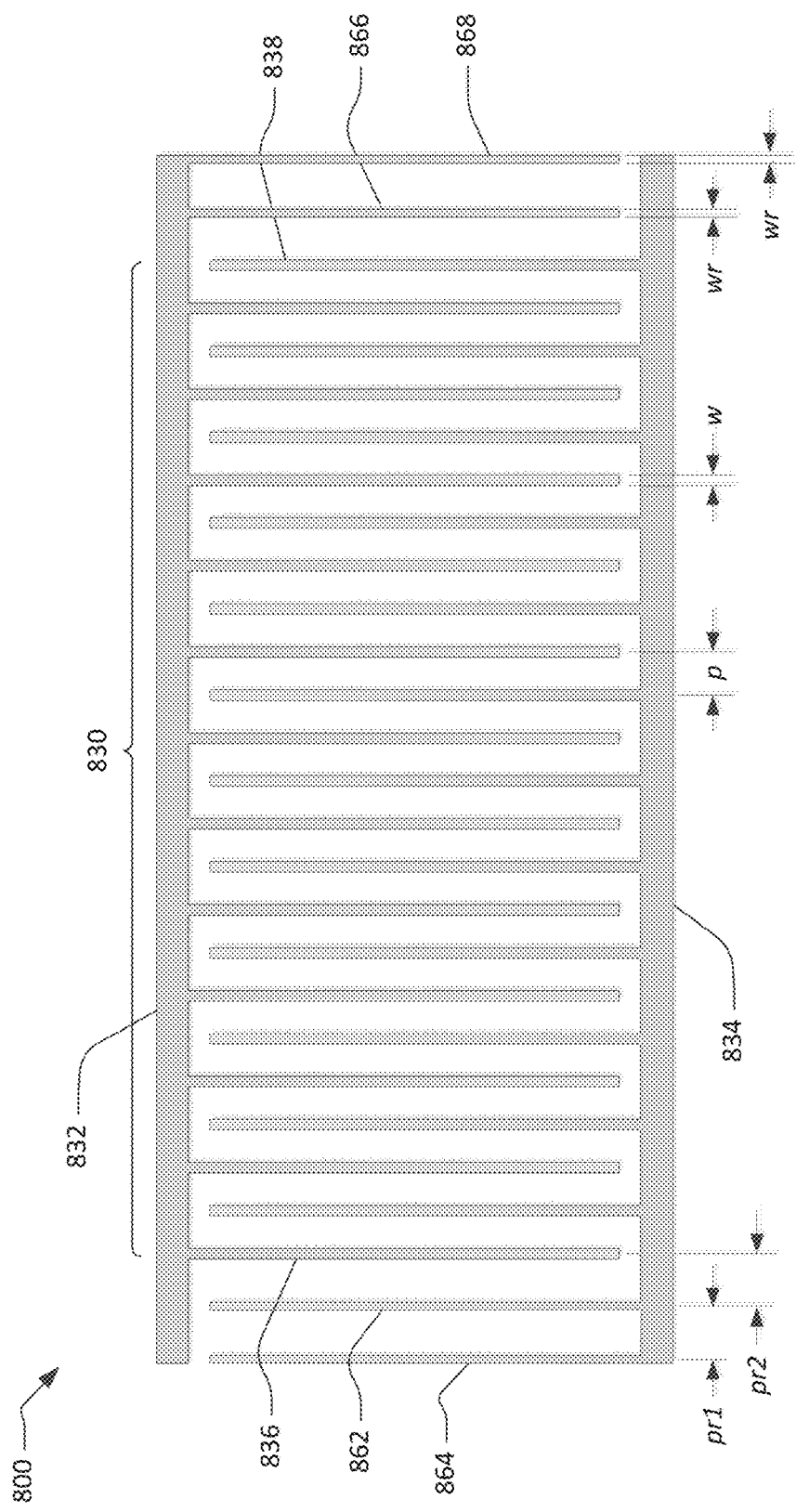
FIG. 8 is a schematic plan view of another IDT with reflector elements.

FIG. 8 is a plan view of another exemplary conductor pattern 800 that reduces the acoustic energy leakage in the longitudinal direction at the ends of an XBAR. The conductor pattern 800 includes an IDT 830 and first, second, third, and fourth reflector elements 862, 864, 866, 868. The IDT 830 includes a first busbar 832, a second busbar 834, and a plurality of interleaved IDT fingers extending alternately from the first and second busbars. In this example, number of IDT fingers, is equal to 24. In other XBARs, the number of fingers may be in a range from 20 to 100 or more IDT fingers. Overlapping portions of the interleaved IDT fingers and the first, second, third, and fourth reflector elements 862, 864, 866, 868 are on the diaphragm of an XBAR. IDT finger 836 is the first finger and IDT finger 838 is the last finger. The designations of the first and last IDT fingers is arbitrary and the designations of the first and last fingers could be reversed.

A total of four reflector elements are provided outside of periphery of the IDT 830. The first and second reflector elements 862, 864 are proximate and parallel to the first IDT finger 836 at the left end (as shown in the figure) of the IDT 830. The third and fourth reflector elements 866, 868 are proximate and parallel to the last IDT finger 838 at the right end (as shown) of the IDT 830.

First and second reflector elements 862, 864 extend from a different busbar than the first IDT finger. In this example, the first and second reflector elements 862, 864 extend from the second busbar 834 and the first IDT finger 836 extends from the first busbar 832. Thus, the electrical potential on the first and second reflector elements 862, 864 is opposite of the potential on the first IDT finger 836. Similarly, third and fourth reflector elements 866, 868 extend from a different busbar than the last IDT finger 838. Thus, the electrical potential on the third and fourth reflector elements 866, 868 is opposite of the potential on the last IDT finger 838.

The reflector elements 862, 864, 866, 868 are configured to confine acoustic energy to the area of the IDT 830 and thus reduce acoustic energy losses in the longitudinal direction. To this end, the center-to-center distance pr1 between adjacent reflector elements (i.e., between the first and second reflector elements and between the third and four reflector elements) is typically greater than or equal to 1.2 times the pitch p of the IDT fingers and less than or equal to 1.5 times p.

The center-to-center distance pr2 between reflector elements and the adjacent IDT fingers (i.e. between the first reflector element and the first IDT finger, and between the third reflector element and the last IDT finger) is typically greater than p and less than pr1. In some cases, pr2 may be the average of p and pr1.

The width wr of the reflector elements 862, 864, 866, 868 is not necessarily equal to the width w of the IDT fingers. As was described previously, the width wr of the reflector elements may be selected to optimize Q-factor at a specific frequency or range of frequencies.

Description of Methods

Figure 9:
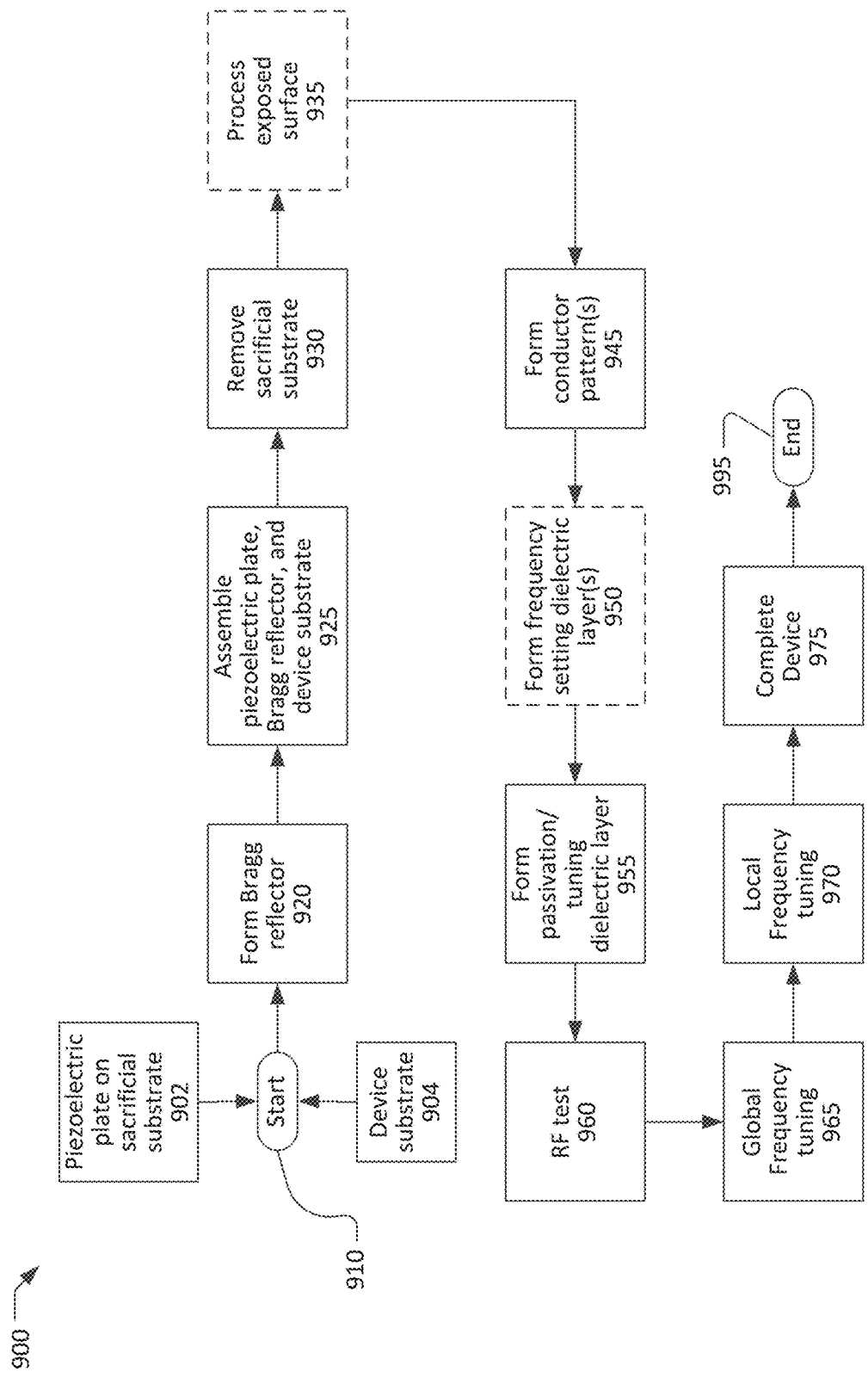
FIG. 9 is a flow chart of a process for fabricating an SM XBAR or a filter implemented with SM XBARs.

FIG. 9 is a simplified flow chart of a method 900 for making a filter incorporating SM XBARs. The method 900 starts at 910 with a piezoelectric film disposed on a sacrificial substrate 902 and a device substrate 904. The method 900 ends at 995 with a completed SM XBAR or filter. The flow chart of FIG. 9 includes only major process steps. Various conventional process steps (e.g. surface preparation, cleaning, inspection, baking, annealing, monitoring, testing, etc.) may be performed before, between, after, and during the steps shown in FIG. 9.

Thin plates of single-crystal piezoelectric materials bonded to a non-piezoelectric substrate are commercially available. At the time of this application, both lithium niobate and lithium tantalate plates are available bonded to various substrates including silicon, quartz, and fused silica. Thin plates of other piezoelectric materials may be available now or in the future. The thickness of the piezoelectric plate may be between 50 nm and 1500 nm. The thickness of the piezoelectric plate at 902 may be equal to a desired final thickness. The thickness of the piezoelectric plate at 902 may be greater than the final thickness and may be trimmed to the final thickness at a later step in the process 900. When the substrate is silicon, a layer of $SiO_2$ may be disposed between the piezoelectric plate and the substrate. The piezoelectric plate 902 may be, for example, z-cut lithium niobate bonded to a silicon wafer with an intervening $SiO_2$ layer. The device substrate 904 may be silicon (as used in the previous examples) fused silica, quartz, or some other material.

At 920 an acoustic Bragg reflector is formed by depositing alternating layers of materials having low and high acoustic impedance as previously described. Each of the layers has a thickness equal to or about one-fourth of the acoustic wavelength. The total number of layers in the acoustic Bragg reflector may typically be from five to eight.

At 920, all of the layers of the acoustic Bragg reflector may be deposited on either the surface of the piezoelectric plate on the sacrificial substrate 902 or a surface of the device substrate 904. Alternatively, some of the layers of the acoustic Bragg reflector may be deposited on the surface of the piezoelectric plate on the sacrificial substrate 902 and the remaining layers of the acoustic Bragg reflector may be deposited on a surface of the device substrate 904.

At 925, the piezoelectric plate on the sacrificial substrate 902 and the device substrate 904 may be bonded such that the layers of the acoustic Bragg reflector are sandwiched between the piezoelectric plate and the device substrate. The piezoelectric plate on the sacrificial substrate 902 and the device substrate 904 may be bonded using a wafer bonding process such as direct bonding, surface-activated or plasma-activated bonding, electrostatic bonding, or some other bonding technique. Note that, when one or more layers of the acoustic Bragg reflector are deposited on both the piezoelectric plate and the device substrate, the bonding will occur between or within layers of the acoustic Bragg reflector.

After the piezoelectric plate on the sacrificial substrate 902 and the device substrate 904 are bonded, the sacrificial substrate, and any intervening layers, are removed at 930 to expose the surface of the piezoelectric plate (the surface that previously faced the sacrificial substrate). The sacrificial substrate may be removed, for example, by material-dependent wet or dry etching or some other process.

An alternative process 900 starts with a single-crystal piezoelectric wafer at 902 instead of a thin piezoelectric plate on a sacrificial substrate of a different material. Ions are implanted to a controlled depth beneath a surface of the piezoelectric wafer (not shown in FIG. 9). The portion of the wafer from the surface to the depth of the ion implantation is (or will become) the thin piezoelectric plate and the balance of the wafer is the sacrificial substrate. The acoustic Bragg reflector is formed at 920 as previously described and the piezoelectric wafer and device substrate are bonded at 925 such that the acoustic Bragg reflector is disposed between the ion-implanted surface of the piezoelectric wafer 902 and the device substrate 904. At 930, the piezoelectric wafer may be split at the plane of the implanted ions (for example, using thermal shock), leaving a thin plate of piezoelectric material exposed and bonded to the acoustic Bragg reflector. The thickness of the thin plate piezoelectric material is determined by the energy (and thus depth) of the implanted ions. The process of ion implantation and subsequent separation of a thin plate is commonly referred to as "ion slicing". The thickness of the piezoelectric plate after ion slicing may be equal to or greater than the desired final thickness.

After the sacrificial substrate is removed at 930, the exposed surface of the piezoelectric plate optionally may be processed at 935. For example, the surface of the piezoelectric plate may be polished or chemo-mechanically polished to remove damaged material, reduce surface roughness, and or reduce the thickness of the piezoelectric plate.

After the surface of the piezoelectric plate is processed at 935, a conductor pattern, including IDTs and reflector elements of each SM XBAR, is formed at 945 by depositing and patterning one or more conductor layers on the trimmed surface of the piezoelectric plate. The conductor pattern may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. When the conductor layer is substantially aluminum, the IDT finger thickness may be from 0.10 to 1.5 times the final thickness of the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 945 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 945 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

In some variations of the process 900, the removal of selected portions of the piezoelectric plate at 935 may be performed after forming the conductors pattern(s) at 945.

At 950, one or more frequency setting dielectric layer(s) may be formed by depositing one or more layers of dielectric material on the front side of the piezoelectric plate. For example, a dielectric layer may be formed over the shunt resonators to lower the frequencies of the shunt resonators relative to the frequencies of the series resonators. The one or more dielectric layers may be deposited using a conventional deposition technique such as physical vapor deposition, atomic layer deposition, chemical vapor deposition, or some other method. One or more lithography processes (using photomasks) may be used to limit the deposition of the dielectric layers to selected areas of the piezoelectric plate. For example, a mask may be used to limit a dielectric layer to cover only the shunt resonators.

At 955, a passivation/tuning dielectric layer is deposited over the piezoelectric plate and conductor patterns. The passivation/tuning dielectric layer may cover the entire surface of the filter except for pads for electrical connections to circuitry external to the filter.

Ideally, after the passivation/tuning dielectric layer is deposited at 955, most or all of the filter devices on a wafer will meet a set of performance requirements. However, normal process tolerances will result in variations in parameters such as the thicknesses of dielectric layer formed at 950 and 955, variations in the thickness and line widths of conductors and IDT fingers formed at 945, and variations in the thickness of the piezoelectric plate. These variations contribute to deviations of the filter device performance from the set of performance requirements.

To improve the yield of filter devices meeting the performance requirements, frequency tuning may be performed by selectively adjusting the thickness of the passivation/tuning layer deposited over the resonators at 955. The frequency of a filter device pass-band can be lowered by adding material to the passivation/tuning layer, and the frequency of the filter device passband can be increased by removing material to the passivation/tuning layer. Typically, the process 900 is biased to produce filter devices with passbands that are initially lower than a required frequency range but can be tuned to the desired frequency range by removing material from the surface of the passivation/tuning layer.

At 960, a probe card or other means may be used to make electrical connections with the filter to allow radio frequency (RF) tests and measurements of filter characteristics such as input-output transfer function. Typically, RF measurements are made on all, or a large portion, of the filter devices fabricated simultaneously on a common piezoelectric plate and substrate.

At 965, global frequency tuning may be performed by removing material from the surface of the passivation/tuning layer using a selective material removal tool such as, for example, a scanning ion mill as previously described. "Global" tuning is performed with a spatial resolution equal to or larger than an individual filter device. The objective of global tuning is to move the passband of each filter device towards a desired frequency range. The test results from 960 may be processed to generate a global contour map indicating the amount of material to be removed as a function of two-dimensional position on the wafer. The material is then removed in accordance with the contour map using the selective material removal tool.

At 970, local frequency tuning may be performed in addition to, or instead of, the global frequency tuning performed at 965. "Local" frequency tuning is performed with a spatial resolution smaller than an individual filter device. The test results from 960 may be processed to generate a map indicating the amount of material to be removed at each filter device. Local frequency tuning may require the use of a mask to restrict the size of the areas from which material is removed. For example, a first mask may be used to restrict tuning to only shunt resonators, and a second mask may be subsequently used to restrict tuning to only series resonators (or vice versa). This would allow independent tuning of the lower band edge (by tuning shunt resonators) and upper band edge (by tuning series resonators) of the filter devices.

After frequency tuning at 965 and/or 970, the filter device is completed at 975. Actions that may occur at 975 include forming bonding pads or solder bumps or other means for making connection between the device and external circuitry (if such pads were not formed at 945); excising individual filter devices from a wafer containing multiple filter devices; other packaging steps; and additional testing. After each filter device is completed, the process ends at 995.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:
1. An acoustic resonator comprising:
a substrate;
a piezoelectric layer;
an acoustic Bragg reflector between a surface of the substrate and a back surface of the piezoelectric layer; and
a conductor pattern on a front surface of the piezoelectric layer, the conductor pattern comprising:
an interdigital transducer (IDT) comprising a first busbar, a second busbar, and interleaved fingers, wherein the interleaved fingers extend alternately from the first and second busbars, and the interleaved fingers comprise a first finger and a last finger at opposing ends of the IDT;
a first reflector element proximate to the first finger; and
a second reflector element proximate to the last finger,
wherein a distance pr between the first reflector element and the first finger and between the second reflector element and the last finger is greater than a pitch p of the IDT, the pitch p being a center-to-center spacing between at least two fingers of the interleaved fingers of the IDT.

2. The acoustic resonator of claim 1, wherein the distance pr is greater than or equal to 1.2 p and less than or equal to 1.5 p.

3. The acoustic resonator of claim 1, wherein a width wr of each of the first and second reflector elements is configured to improve a Q-factor of the acoustic resonator at a predetermined frequency.

4. The acoustic resonator of claim 1, wherein:
the first reflector element is connected to a same one of the first and second busbars as the first finger, and
the second reflector element is connected to a same one of the first and second busbars as the last finger.

5. The acoustic resonator of claim 1, wherein:
the first reflector element is connected to an opposite one of the first and second busbars as the first finger, and
the second reflector element is connected to an opposite one of the first and second busbars as the last finger.

6. The acoustic resonator of claim 1, wherein the first and second reflector elements are floating.

7. The acoustic resonator of claim 1 further comprising:
a third reflector element proximate and parallel to the first reflector element, the third reflector element disposed such that the first reflector element is between the third reflector element and the first finger; and
a fourth reflector element proximate and parallel to the second reflector element, the fourth reflector element disposed such that the second reflector element is between the fourth reflector element and the last finger.

8. The acoustic resonator of claim 7, wherein a distance pr2 between the first and third reflector elements and between the second and fourth reflector elements is greater than or equal to 1.2 p and less than or equal to 1.5 p.

9. The acoustic resonator of claim 8, wherein pr=pr2.

10. The acoustic resonator of claim 8, wherein pr=(p+pr2)/2.

11. The acoustic resonator of claim 1, wherein the first reflector element of the conductor pattern extends in a direction parallel to the first finger, and the second reflector element of the conductor pattern extends in a direction parallel to the last finger.

12. A filter device comprising:
a plurality of bulk acoustic resonators, wherein at least one of the plurality of bulk acoustic resonators comprises:
a substrate;
a piezoelectric layer;

an acoustic Bragg reflector between a surface of the substrate and a back surface of the piezoelectric layer; and a conductor pattern on a front surface of the piezoelectric that includes an interdigital transducer (IDT) comprising a first busbar, a second busbar, and interleaved fingers extending alternately from the first and second busbars, the interleaved fingers comprise a first finger and a last finger at opposing ends of the IDT, wherein the IDT comprises:

a first reflector element proximate to the first finger; and a second reflector element proximate to the last finger, and wherein a distance pr between the first reflector element and the first finger and between the second reflector element and the last finger is greater than a pitch p of the IDT, the pitch p being a center-to-center spacing between at least two fingers of the interleaved fingers of the IDT.

13. The filter device of claim 12, wherein the first reflector element of the IDT extends in a direction parallel to the first finger, and the second reflector element of the IDT extends in a direction parallel to the last finger.

14. The filter device of claim 12, wherein the distance pr is greater than or equal to 1.2 p and less than or equal to 1.5 p.

15. The filter device of claim 12, wherein a width wr of each of the first and second reflector elements is configured to improve a Q-factor of the respective resonator at a predetermined frequency.

16. The filter device of claim 15 wherein:
the IDT is part of a shunt resonator, and
the width wr is configured to improve the Q-factor of the shunt resonator at a lower edge of a pass-band of the filter device.

17. The filter device of claim 15 wherein:
the IDT is part of a series resonator, and
the width wr is configured to improve the Q-factor of the series resonator at an upper edge of a pass-band of the filter device.

18. The filter device of claim 12, wherein the IDT of the at least one bulk acoustic resonator further comprises:

a third reflector element proximate to the first reflector element, the third reflector element disposed such that the first reflector element is between the third reflector element and the first finger; and a fourth reflector element proximate to the second reflector element, the fourth reflector element disposed such that the second reflector element is between the fourth reflector element and the last finger.

19. The filter device of claim 18, wherein a distance pr2 between the first and third reflector elements and between the second and fourth reflector elements is greater than or equal to 1.2 p and less than or equal to 1.5 p.

20. The filter device of claim 19, wherein pr=pr2.

21. The filter device of claim 19, wherein pr=(p+pr2)/2.

* * * * *